United States Patent [19]

Funaba

[11] Patent Number: 5,281,844
[45] Date of Patent: Jan. 25, 1994

[54] AVALANCHE PHOTODIODE

[75] Inventor: Shinji Funaba, Itami, Japan

[73] Assignee: Mitsubishi Denki Kabushiki Kaisha, Tokyo, Japan

[21] Appl. No.: 863,761

[22] Filed: Apr. 6, 1992

[30] Foreign Application Priority Data

Apr. 18, 1991 [JP] Japan .................. 3-086835

[51] Int. Cl.⁵ .............. H01L 29/90; H01L 27/14; H01L 31/00
[52] U.S. Cl. ..................... 257/438; 257/436
[58] Field of Search ............. 257/438, 436, 21

[56] References Cited

U.S. PATENT DOCUMENTS

| 4,684,969 | 8/1987 | Taguchi | 357/30 |
| 5,075,750 | 12/1991 | Kagawa | 357/30 |

FOREIGN PATENT DOCUMENTS

| 61-226973 | 10/1986 | Japan | 257/438 |
| 62-48079 | 3/1987 | Japan | 257/438 |
| 63-281480 | 11/1988 | Japan | 257/438 |
| 1-261874 | 10/1989 | Japan . | |

OTHER PUBLICATIONS

"Hikari Tsuushin Soshi Kougaku", Optical Communication Device Engineering, H. Yonezu, Feb. 1984, pp. 418–419.

Primary Examiner—Jerome Jackson
Assistant Examiner—D. Monin
Attorney, Agent, or Firm—Leydig, Voit & Mayer

[57] ABSTRACT

A novel avalanche photodiode includes an n-type semiconductor substrate, an n-type light-absorbing layer on the substrate, an n-type multiplication layer on the light-absorbing layer, and a p-type light-receiving layer. The multiplication layer includes a plurality of pairs of semiconductor layers, with each pair including one high dopant impurity concentration layer and one low dopant impurity concentration layer.

4 Claims, 3 Drawing Sheets

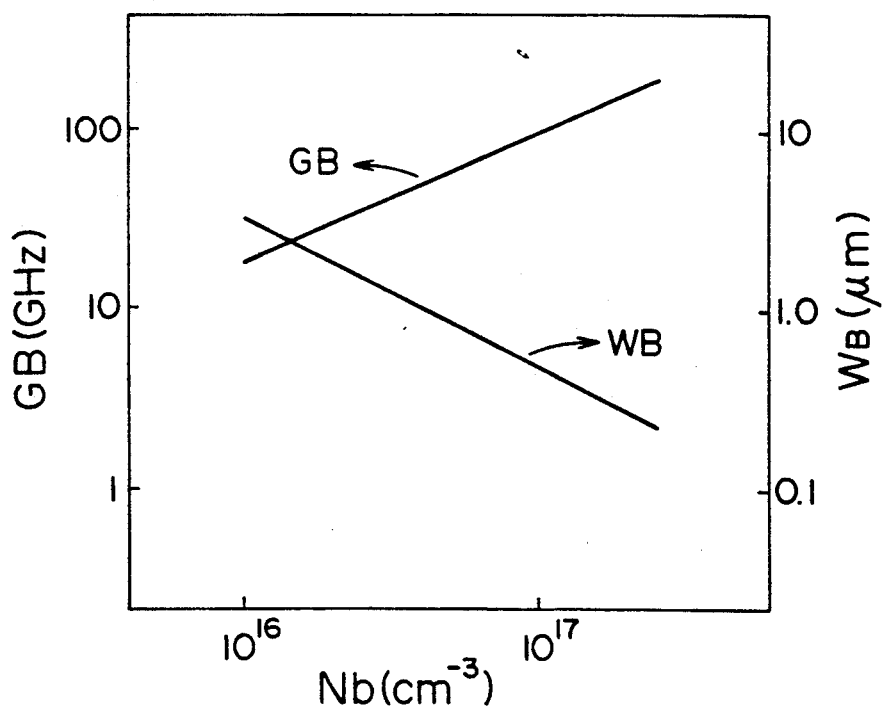
F I G. 2

AVALANCHE PHOTODIODE

The present invention relates to an avalanche photodiode for use in optical communications systems for detecting a small optical signal, and also to a method of making such an avalanche photodiode.

BACKGROUND OF THE INVENTION

One example of a conventional avalanche photodiode 10 is shown in FIG. 1. This avalanche photodiode is fabricated by disposing an $n^-$-type InGaAs light-absorbing layer 2 on an $n^+$-type InP substrate 1, disposing an n-type InP multiplication layer 3 on the light-absorbing layer 2, selectively diffusing a p-type impurity from the top surface of the multiplication layer 3 to thereby form a $p^+$-type light-receiving region 4.

A voltage is applied from a voltage source 5 between the $p^+$-type light-receiving region 4 and the substrate 1 to provide a reverse bias voltage slightly smaller than the voltage which could cause avalanche breakdown of the $p^+$-n junction formed between the multiplication layer 3 and the $p^+$-type light-receiving region 4, as shown in FIG. 1. In such a reverse bias condition, a depletion region 6 is formed in the multiplication layer 3 and the light-absorbing layer 2. An optical signal incident on the $p^+$-type light-receiving region 4 passes through the depletion region 6 to reach the light-absorbing layer 2, where it is absorbed to generate electron-hole pairs. Due to an electric field, holes drift and are injected into the depletion region 6. The injected holes are accelerated in the multiplication layer 3 and collide with lattice atoms in the depletion region 6 with high kinetic energy so that the atoms are ionized to produce electron-hole pairs. The phenomena occur in a concatenating fashion so that a large number of holes and electrons are generated. The thus generated holes flow through the light-receiving region 4 to the voltage source 5. On the other hand, the electrons flow from the depletion region 6 through the light-absorbing layer 2 and the substrate 1 to the voltage source 5. Thus, a multiplied current corresponding to the optical signal incident on the light-receiving region 4 flows.

It has been desired to improve the gain bandwidth product (GB product) of avalanche photodiodes. In order to improve the GB product of an avalanche photodiode such as the one shown in FIG. 1, it is necessary to increase the maximum electric field in the depletion region 6 so that holes can pass through the depletion region 6 as fast as possible, which, in turn, requires that the field gradient in the depletion region 6 be made steep by increasing the carrier concentration in the multiplication layer 3. This results in increase of the maximum field. In order to increase the carrier concentration in the multiplication layer 3, the distance WB (FIG. 1) between the bottom surface of the light-receiving region 4 and the upper surface of the multiplication layer 3 should be made smaller. FIG. 2 illustrates the relationship between the carrier concentration Nb of the multiplication layer 3 and the GB product of the avalanche photodiode, and the relationship between the carrier concentration Nb and the width WB. It is seen that in order to increase the GB product, the carrier concentration must be increased, which requires that the thickness WB must be made smaller. In particular, if the carrier concentration of the multiplication layer 3 is desired to be increased to $2 \times 10^{17}$ cm$^{-3}$ so as to provide a GB product of 100 or more, the thickness WB must be decreased to a value on the order of 0.2 μm. The precision of the thickness WB is dependent on the precision of the selective diffusion into the $p^+$-type light-receiving region 4. For a small thickness WB, on the order of 0.2 μm, the selective diffusion of an impurity into the region 4 must be controlled with a precision of the order of 0.1 μm. It has been difficult to control a selective diffusion with a precision of the order of 0.1 μm.

Japanese Unexamined Patent Publication No. HEI 1-261874, for example, discloses a technique for improving a GB product of the photodetector. According to this Japanese patent application, an InP layer and one higher impurity concentration $n^+$-type InP layer and one lower impurity concentration $n^-$-type is disposed immediately beneath a $p^+$-type light-receiving region, with the $n^-$-type InP layer being disposed adjacent to the light-receiving region. The set of these InP layers is used as a multiplication layer with an increased thickness, so as to provide a large GB product. This Japanese application states that the thicknesses of the lower and higher impurity concentration layers are 0.3-0.6 μm, but it is silent about the ratio of the thicknesses. Assuming that the thicknesses of the higher and lower impurity concentration layers are equal to each other, the maximum field in the higher impurity concentration layer is smaller so that sufficient multiplication cannot be expected.

An object of the present invention is to provide an avalanche photodiode free of the above-stated disadvantages, and also a method of making such an improved avalanche photodiode.

SUMMARY OF THE INVENTION

An avalanche photodiode according to the present invention includes a semiconductor substrate of a first conductivity type, a light-absorbing layer of the first conductivity type disposed on the substrate, a multiplication layer of the first conductivity type disposed on the light-absorbing layer, and a light-receiving layer of a second conductivity type disposed on the multiplication layer. The multiplication layer comprises plural sets of layers of higher and lower impurity concentrations. Higher impurity concentration layers may be thinner than lower impurity concentration layers.

In a method of making an avalanche photodiode according to the present invention, a light-absorbing layer of a first conductivity type is disposed on an upper surface of a semiconductor substrate of the first conductivity type, plural sets each comprising a higher impurity concentration semiconductor layer of the first conductivity type and a lower impurity concentration semiconductor layer of the first conductivity type are disposed in a stack on the upper surface of the light-absorbing layer, a semiconductor layer of the first conductivity type is disposed on the stack, and an impurity of a second conductivity type is diffused into the last-mentioned semiconductor layer of the first conductivity type.

BRIEF DESCRIPTION OF THE DRAWINGS

FIG. 2 shows the relationship between GB product and carrier concentration of an avalanche photodiode, and also the relationship between the thickness of the multiplication layer and carrier concentration;

DESCRIPTION OF A PREFERRED EMBODIMENT

Figure 3:
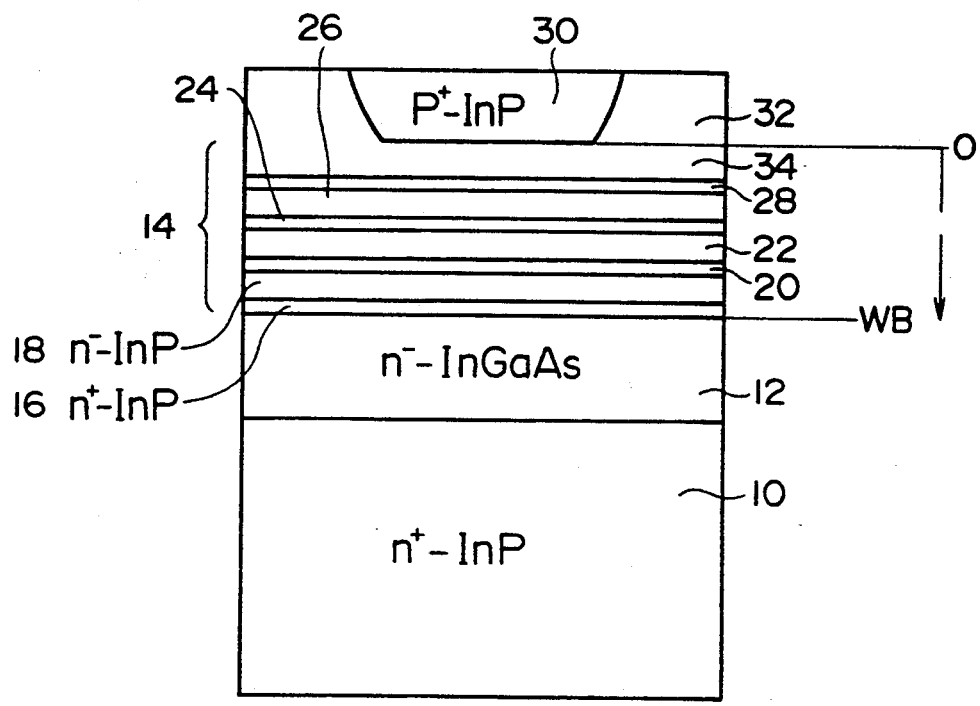
FIG. 3 is a cross-sectional view of an avalanche photodiode according to one embodiment of the present invention.

An embodiment of the present invention is shown in FIG. 3. The avalanche photodiode shown in FIG. 3 includes an n+-type InP substrate 10. The substrate 10 has a thickness of, for example, 100–300 μm, and contains sulfur or tin as an impurity. The impurity concentration is on the order of, for example, $10^{18}$ cm$^{-3}$. A light-absorbing layer 12 is disposed on the substrate 10. The light-absorbing layer 12 is, for example, an n−-type $In_{0.53}Ga_{0.47}As$ layer and has a thickness of, for example, 2–4 μm. The light-absorbing layer 12 contains sulfur or tin as an impurity in a concentration of the order of, for example, $10^{15}$ cm$^{-3}$.

A multiplication layer 14 is disposed on the light-absorbing layer 12. The multiplication layer 14 includes an n+-type InP layer 16 having a higher impurity concentration, and an n−-type InP layer 18 having a lower impurity concentration disposed on the layer 16. The thickness of the n+-type InP layer 16 is, for example, 0.07 μm. Sulfur or tin is used as an impurity for the layer 16, and its concentration is, for example, $5 \times 10^{16}$ cm$^{-3}$. The thickness of the n−-type InP layer 18 is, for example, 0.23 μm. Sulfur or tin is used as an impurity for the layer 18, and its concentration is, for example, $1 \times 10^{16}$ cm$^{-3}$. As stated above, the n+-type InP layer 16 is thinner than the n−-type InP layer 18.

An n+-type InP layer 20 similar to the n+-type InP layer 16 is disposed on the n−-type InP layer 18, and on the n+-type InP layer 20, an n−-type InP layer 22 similar to the n−-type InP layer 18 is disposed. Similarly, an n+-type InP layer 24 similar to the layer 16 is disposed on the n−-type InP layer 22, and an n−-type InP layer 26 similar to the layer 18 is disposed on the n+-type InP layer 24. Furthermore, an n+-type InP layer 28 similar to the layer 16 is disposed on the n−-type InP layer 26. An n−-type InP layer 32 is disposed on the n+-type InP layer 28. As will be described later, a light-receiving region 30 is formed within the layer 32 by selective diffusion.

The thickness of the portion 34 of the n−-type InP layer 32 which is located between the bottom surface of the light-receiving region 30 and the top surface of the n+-type InP layer 28 is approximately the same as the thickness of the n−-type InP layer 18. The n+-type InP layer 16, the n−-type InP layer 18, the n+-type InP layer 20, the n−-type InP layer 22, the n+-type InP layer 24, the n−-type InP layer 26, the n+-type InP layer 28, and the portion 34 of the n−-type layer 32 form the multiplication layer 14. The multiplication layer 14 comprises plural sets of n−-type and n+-type InP layers, each set including one n−-type InP layer and one n+-type InP layer. In the embodiment shown in FIG. 3, four such sets are used. The thickness WB of the multiplication layer 14 as a whole is about 1.2 μm.

The light-receiving region 30 is a p+-type InP region, which has a thickness of, for example, 1 μm. For example, zinc or cadmium is used as an impurity for the region 30. The impurity concentration is on the order of, for example, $10^{18}$ cm$^{-3}$.

The avalanche photodiode of FIG. 3 may be fabricated in the following manner.

First, the light-absorbing layer 12, the n+-type InP layer 16, the n−-type InP layer 18, the n+-type InP layer 20, the n−-type InP layer 22, the n+-type InP layer 24, the n−-type InP layer 26, the n+-type InP layer 28, and the n−-type layer 32 are successively grown in the named order on the substrate 10 by, for example, an MOCVD or MBE technique. Then, p+-type InP region 30 is formed by selective diffusion into the n−-type InP layer 32 from above the layer 32.

As in the previously described conventional avalanche photodiode, a reverse bias voltage is applied between the p+-type light-receiving region 30 and the substrate 10, which reverse bias voltage is slightly smaller than the reverse bias voltage which could cause avalanche breakdown of the p+-n junction formed between the multiplication layer 14 and the p+-type light-receiving region 30. A light signal impinging on the p+-type light-receiving region 30 passes through the multiplication layer 14 to the light-absorbing layer 12, where it produces hole-electron pairs. Holes are directed to the multiplication layer 14 by the depletion region formed in the multiplication layer 14, where they collide with the lattice atoms to ionize them and produce hole-electron pairs. Holes further travel through the multiplication layer 14 and develop further hole-electron pairs. A number of holes and electrons are further produced in a similar manner, and the thus produced holes are directed to the p+-type light-receiving region 30, whereas the electrons travel through the light-absorbing layer 12 to the substrate 10.

Figure 4:
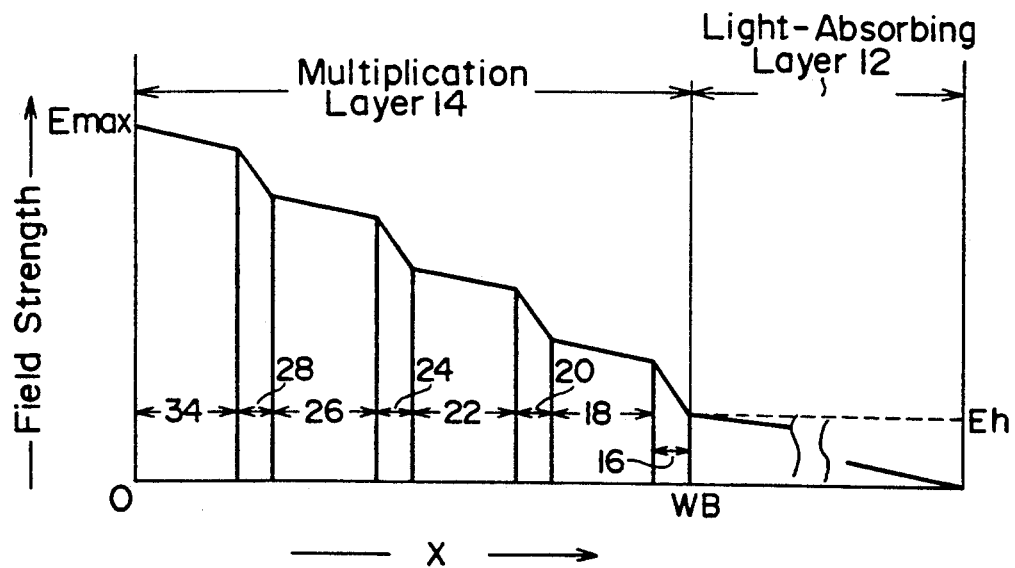
FIG. 4 shows an electric field distribution in the avalanche photodiode shown in FIG. 3.

FIG. 4 shows an electric field distribution in the depth direction in the multiplication layer 14 and the light-absorbing layer 12. The depth x is platted along the abscissa, and the field intensity is platted along the ordinate. x=0 represents the location of the p+-n junction formed by the p+-type light-receiving region 30 and the n−-type InP layer 32, and x=WB represents the location of the heterojunction formed between the multiplication layer 14 and the light-absorbing layer 12. Emax is the electric field at x=0, and Eh is the electric field at x=WB (i.e. the heterojunction field). With the multiplication layer 14 and the light-absorbing layer 12 of the above-described structures, Emax is $5 \times 10^5$ V/cm and Eh is $1.5 \times 10^5$ V/cm. The electric field gradient in the n+-type InP layer 16, the n−-type InP layer 18, the n+-type InP layer 20, the n−-type InP layer 22, the n+-type InP layer 24, the n−-type InP layer 26, the n+-type InP layer 28, and the n−-type region 34 is stepped. That is, it is steep in the n+-type InP layers 16, 20, 24 and 28 and is less steep in the n−-type InP layers 18, 22, 26 and 34, as shown. The average field gradient is approximately the same as to that of a multiplication layer which comprises a single n−-type InP layer having a thickness of about 2 μm and having an impurity concentration of $2.5 \times 10^{16}$ cm$^{-3}$. The steeper field gradient is attributable to the fact that the n+-type InP layers 16, 20, 24 and 28 have a higher impurity concentration and a smaller thickness, and the less steeper gradient is attributable to the fact that the n−-type InP layers 18, 22, 26 and 34 have a lower impurity concentration and a larger thickness.

Holes from the light-absorbing layer 12 are accelerated greatly in the steep field gradient n+-type InP layers 16, 20, 24 and 28, where they ionize lattice atoms to generate electron-hole pairs. The thus generated holes advance to the p+-type light-absorbing region 30, whereas the electrons are directed through the light-absorbing layer 12 toward the substrate 10 due to the field in the depletion region.

Because the multiplication layer 14 comprises the alternating high impurity concentration, steep field gradient n+-type InP layers 16, 20, 24 and 28 and the low impurity concentration, lower field gradient n−-type InP layers 18, 22, 26 and 34, the thickness of the multiplication layer 14 can be made larger than usually required. Furthermore, because of the steep field gradient n+-type InP layers 16, 20, 24 and 28, the GB product of the photodiode is improved. In addition, because a lower impurity concentration n−-type InP layer comprises the separate layers 18, 22, 26 and 34, the response of the device is also improved.

Figure 1:
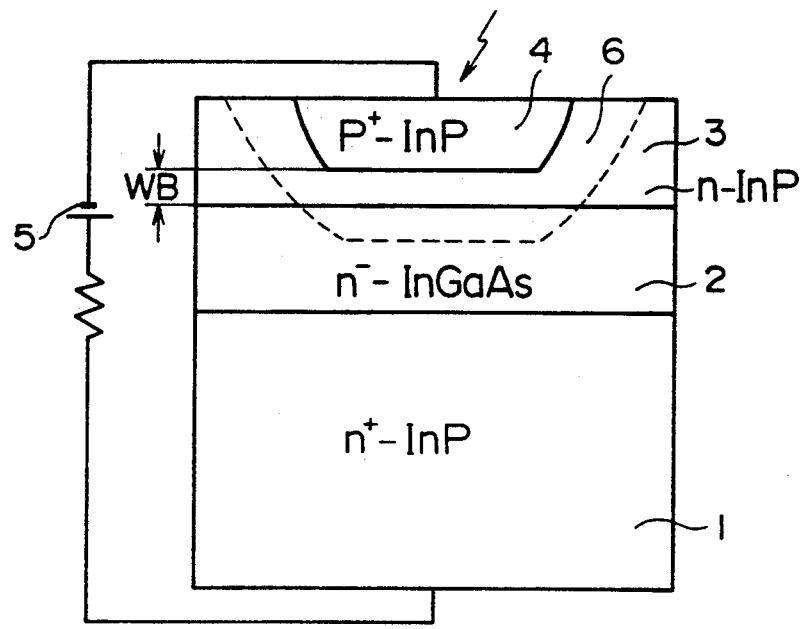
FIG. 1 is a cross-sectional view of a conventional avalanche photodiode.
Figure 5:
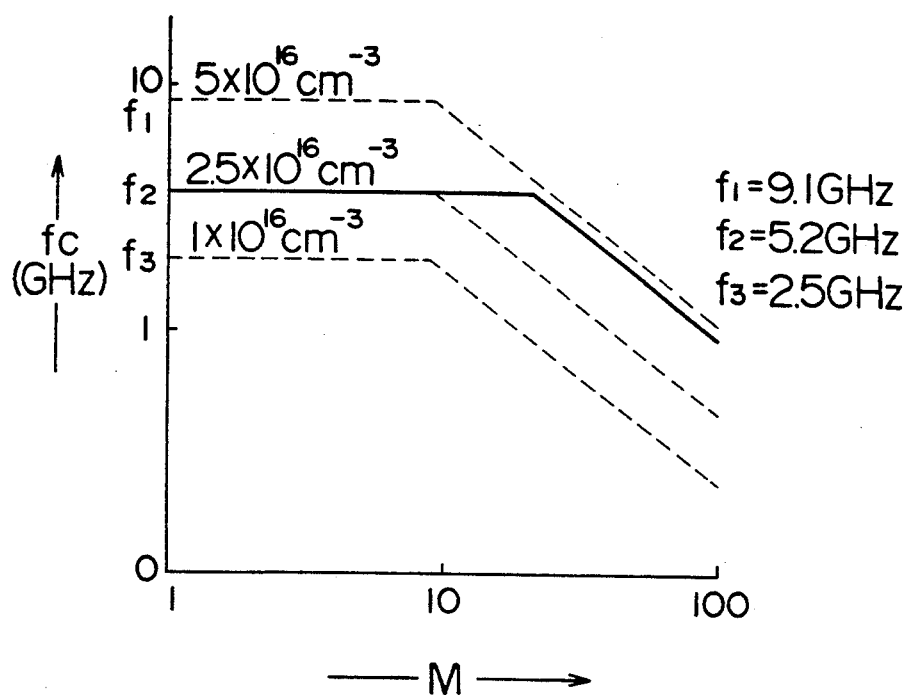
FIG. 5 illustrates relationships between cutoff frequency and multiplication factor of the avalanche photodiode of the present invention and the conventional avalanche photodiode.

In FIG. 5, the solid line indicates the dependency of the cutoff frequency $f_c$ on the multiplication factor M of the avalanche photodiode of the present embodiment. The cutoff frequency is constant at 5.2 GHz in the range of multiplication factor M of from 1 to about 20, and decreases with an increase of the multiplication factor M above about 20. The broken lines in FIG. 5 indicate the dependency of the cutoff frequency on the multiplication factor M of the conventional avalanche photodiodes of the structure shown in FIG. 1, when the impurity concentration of the multiplication layer is $5 \times 10^{16}$ cm$^{-3}$, $2.5 \times 10^{16}$ cm$^{-3}$, or $1 \times 10^{16}$ cm$^{-3}$ with the thickness WB determined in accordance with the relationship shown in FIG. 2. In the three cases of the conventional avalanche photodiode, the cutoff frequencies $f_1$, $f_2$ and $f_3$ are shown constant at 9.1 GHz, 5.2 GHz and 2.5 GHz, respectively, in the multiplication factor range of from 1 to about 10, and decrease with an increase of the multiplication factor M in the range above about 10. The region in FIG. 5 where the cutoff frequency is constant is a region in which the response is limited by the WB-dependent transit time, and the region in which the product of the cutoff frequency and the amplification factor M is constant (i.e. the region in which the cutoff frequency decreases with increase of the amplification factor M) is a region in which the response is limited by the build-up time or GB product. The avalanche photodiode of the present invention exhibits a cutoff frequency characteristic similar to that of the conventional one employing an impurity concentration of $2.5 \times 10^{16}$ cm$^{-3}$, in the range of small amplification factors M, and exhibits a cutoff frequency characteristic similar to that of the conventional photodiode employing an impurity concentration of $5 \times 10^{16}$ cm$^{-3}$ in the range of large multiplication factors M. That is, the avalanche diode according to the illustrated embodiment has an improved GB product in the region where the amplification factor is large.

In the illustrated embodiment, the number of the sets of higher and lower impurity concentration layers is four, but the number of sets may be equal to two or more. Furthermore, in the illustrated embodiment, the conductivity type of the substrate 10, the light-absorbing layer 12, and the multiplication layer 14 is n-type and that of the light-receiving region 30 is p-type, but the substrate 10, the light-absorbing layer 12, and the multiplication layer 14 may be p-type with the light-receiving region 30 being n-type.

What is claimed is:

1. An avalanche photodiode comprising:
   a semiconductor substrate of a first conductivity type;
   a semiconductor light-absorbing layer of the first conductivity type disposed on said substrate;
   a multiplication layer of the first conductivity type disposed on said light-absorbing layer, said multiplication layer comprising a plurality of pairs of first and second semiconductor layers, each first semiconductor layer containing a first dopant impurity concentration and each second semiconductor layer containing a second dopant impurity concentration smaller than the first dopant impurity concentration, each of said first semiconductor layers having a dopant impurity concentration of about $5 \times 10^{16}$ cm$^{-3}$ and a thickness of about 0.07 μm, each of said second semiconductor layers having a dopant impurity concentration of about $1 \times 10^{16}$ cm$^{-3}$ and a thickness of about 0.23 μm; and
   a semiconductor light-receiving layer of a second conductivity type disposed on said multiplication layer.

2. An avalanche photodiode according to claim 1 wherein the first semiconductor layer in each pair of layers is closer to said light-absorbing layer than the second semiconductor layer in that pair.

3. An avalanche photodiode according to claim 1 wherein said multiplication layer comprises four pairs of first and second semiconductor layers.

4. An avalanche photodiode according to claim 1 wherein said substrate, said light-absorbing layer, said multiplication layer, and said light-receiving layer are InP.

* * * * *